United States Patent
Raberg et al.

(10) Patent No.: US 10,317,480 B2
(45) Date of Patent: Jun. 11, 2019

(54) MAGNETO RESISTIVE DEVICE

(71) Applicant: Infineon Technologies AG, Neubiberg (DE)

(72) Inventors: Wolfgang Raberg, Sauerlach (DE); Andreas Strasser, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 517 days.

(21) Appl. No.: 14/881,226

(22) Filed: Oct. 13, 2015

(65) Prior Publication Data
US 2016/0109537 A1 Apr. 21, 2016

Related U.S. Application Data

(60) Provisional application No. 62/063,997, filed on Oct. 15, 2014.

(51) Int. Cl.
*G01R 33/09* (2006.01)
*G01P 3/487* (2006.01)

(52) U.S. Cl.
CPC ............ *G01R 33/091* (2013.01); *G01P 3/487* (2013.01)

(58) Field of Classification Search
None
See application file for complete search history.

(56) References Cited

U.S. PATENT DOCUMENTS

| | | | | |
|---|---|---|---|---|
| 2002/0055016 A1* | 5/2002 | Hiramoto | ............... | B82Y 10/00 428/811 |
| 2005/0054120 A1* | 3/2005 | Wakui | ................... | B82Y 25/00 438/3 |
| 2007/0001251 A1* | 1/2007 | Saito | ...................... | G11C 11/16 257/421 |
| 2008/0212238 A1* | 9/2008 | Watanabe | .......... | G11B 5/59633 360/319 |
| 2009/0015252 A1* | 1/2009 | Raberg | ................... | B82Y 25/00 324/252 |
| 2011/0143166 A1* | 6/2011 | Kawakami | ............. | B82Y 25/00 428/828 |
| 2011/0169488 A1* | 7/2011 | Mather | .............. | G01R 33/0035 324/252 |
| 2012/0200292 A1* | 8/2012 | Sugihara | ................ | B82Y 25/00 324/252 |
| 2013/0073598 A1* | 3/2013 | Jacobson | ................ | G06F 7/588 708/252 |

FOREIGN PATENT DOCUMENTS

| CN | 1598609 A | 3/2005 |
|---|---|---|
| CN | 103261905 A | 8/2013 |
| CN | 103543417 A | 1/2014 |
| CN | 103874929 A | 6/2014 |
| CN | 104567950 A | 4/2015 |

OTHER PUBLICATIONS

Office Action dated Mar. 23, 2018 for Chinese Application No. 201510663825.6.

* cited by examiner

*Primary Examiner* — Melissa J Koval
*Assistant Examiner* — Nasima Monsur
(74) *Attorney, Agent, or Firm* — Schiff Hardin LLP

(57) ABSTRACT

A magneto resistive device having a plurality of magneto resistive sensing elements. Each of the plurality of magneto resistive sensing elements has a free layer and a reference layer. The free layer has a rounded convex contour with an aspect ratio of 2 or greater. There may be one hundred or more magneto resistive sensing elements.

22 Claims, 10 Drawing Sheets

MAGNETO RESISTIVE DEVICE

TECHNICAL FIELD

Embodiments described herein relate to magneto resistive devices and in particular to magnetic sensors using magneto resistive sensing elements of a spin-valve type.

BACKGROUND

Magnetic sensors are used in many applications, e.g. for speed sensing. Speed sensors include sensors which sense a rotation of an element around an axis and are capable to output signals indicative of a rotational speed of the sensor. Magnetic speed sensors use a magnetic field variation caused by a rotation of the element to sense the rotational speed. Magnetic speed sensors can be used in many applications for example to sense a rotation speed of a wheel, a cam shaft, crank shaft or a transmission. Typically, magnetic encoders such as pole wheels or ferromagnetic gear wheels are mounted on the rotating axis to generate magnetic field variations based on the rotation of the axis. For some applications, bias magnets may be provided close to the sensor to provide a biasing magnetic field.

SUMMARY

According to an embodiment, a magnetic speed sensor comprises a plurality of magneto resistive sensing elements of a spin valve type wherein the magneto resistive sensing elements are electrically connected to form a sensing arrangement. Each of the plurality of magneto resistive sensing elements has at least a free layer and a reference system, wherein the free layer of each magneto resistive sensing element has a rounded and continuous convex shape and an aspect ratio equal to or greater than 2.

According to a further embodiment, a magnetic speed sensor comprises at least one hundred magneto resistive sensing elements of a spin-valve type electrically connected to form a sensing arrangement, wherein each of the plurality of magneto resistive sensing elements comprises a free layer and a reference layer.

According to a further embodiment, a magnetic speed sensor includes a plurality of magneto resistive sensing elements electrically connected to form a sensing arrangement, each of the plurality of magneto resistive sensing elements including a free layer and a reference system, wherein the plurality of magneto resistive sensing elements include 100 or more magneto resistive sensing elements.

According to a further embodiment, a method comprises sensing a rotation around an axis with a magnetic speed sensor. The magnetic speed sensor comprises a plurality of magneto resistive sensing elements of a spin-valve type forming a sensing arrangement. Each of the plurality of magneto resistive sensing elements comprises a free layer and a reference layer. The sensing arrangement comprises a Bridge circuit, wherein each resistor of the Bridge circuit comprises at least more than 100 magneto resistive sensing elements.

According to a further embodiment, a magneto resistive device comprises a plurality of magneto resistive sensing elements and a connecting structure to electrically connect respective magneto resistive elements of the plurality of magneto resistive elements. The connecting structure comprises vertical extending portions, wherein a respective vertical extending portion contacts a respective magneto resistive element along an interface plane, wherein the vertical extending portion extends in a lateral direction along the interface plane beyond the magneto resistive element.

DETAILED DESCRIPTION

Figure 1A:
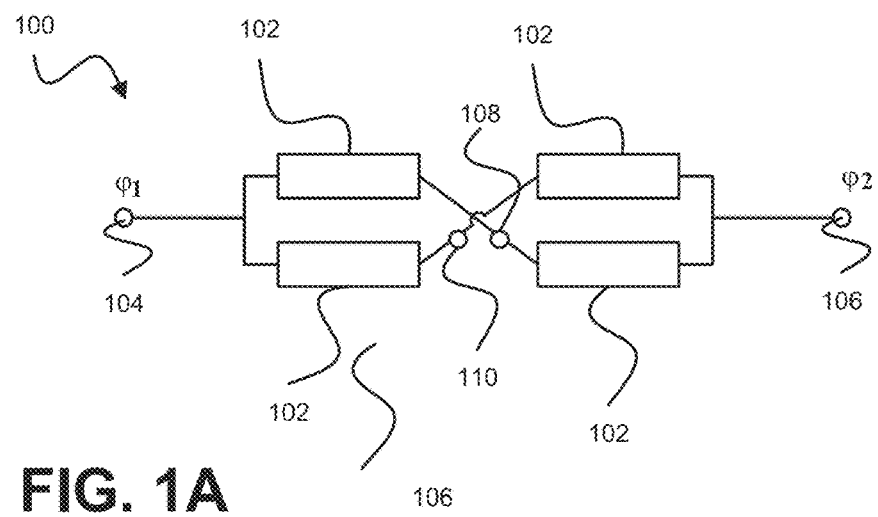
FIG. 1A shows a circuit according to an embodiment.

The following detailed description explains exemplary embodiments of the present invention. The description is not to be taken in a limiting sense, but is made only for the purpose of illustrating the general principles of embodiments of the invention while the scope of protection is only determined by the appended claims.

It is to be understood that the features of the various exemplary embodiments described herein may be combined with each other, unless specifically noted otherwise.

In the various figures, identical or similar entities, modules, devices etc. may have assigned the same reference number. Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions are exaggerated for clarity.

In the described embodiments, various specific views or schematic views of elements, devices, features, etc. are shown and described for a better understanding of embodiments. It is to be understood that such views may not be drawn to scale. Furthermore, such embodiments may not show all features, elements etc. contained in one or more figures with a same scale, i.e. some features, elements etc. may be shown oversized such that in a same figure some features, elements, etc. are shown with an increased or decreased scale compared to other features, elements etc.

It will be understood that when an element is referred to as being "on," "between", "connected to," "electrically connected to," or "coupled to" to another component, it may be directly on, between, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

Embodiments described below are directed to new concepts for magneto resistive sensors and magneto resistive speed sensors. The described embodiments allow for example a jitter-improved magnetic sensing of a rotation.

FIG. 1A shows a sensor arrangement 100 of a magnetic speed sensor with resistors 102 forming a Wheatstone bridge arrangement of two cross-coupled half bridges. The Wheatstone bridge is connected at a first node 104 to a first potential φ1 e.g. ground potential and at a second node 106 to a second potential φ2, e.g. a positive supply potential. Sensing signals are tapped at a signal tap node 108 arranged between the two resistors forming the first half bridge and a signal tap node 110 between the two resistors forming the second half bridge. The two sensing signals may be further processed as differential signals in an analog circuitry of a signal processing element or may be converted to digital signals and processed in digital circuitry of a signal processing element. The circuitry may be integrated with the sensor arrangement 100 or may be separate. In some embodiments, the sensed signals may be transmitted to an external processing device such as an external microcontroller.

Figure 1B:
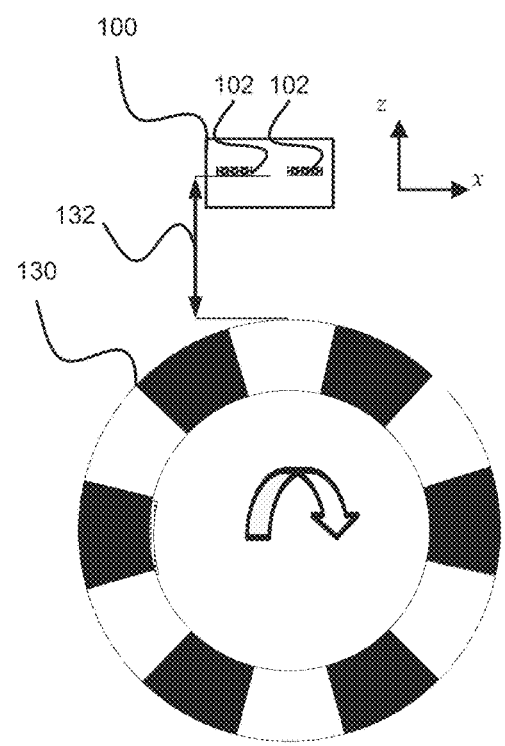
FIG. 1B shows a schematic view of a rotating sensing system including a rotating element.

FIG. 1B shows an example system including the sensor arrangement 100. The system has a rotating part rotating around an axis and an encoder wheel 130 fixed to the rotating part to provide magnetic variations depending on a rotation around the axis. In the system shown in FIG. 1B, the encoder wheel includes a plurality of magnetic north pole elements shown in black and magnetic south pole elements show in white. The sensor arrangement 100 is arranged with a gap distance 132 from the encoder wheel.

The sensor arrangement 100 may be arranged such that the resistors 102 change resistance in view of variation of the magnetic field components tangential to the rotation, e.g. in the x-direction shown in FIG. 1B. However, it is to be understood that in other embodiments, the sensor may also be sensing one or more magnetic field components in other directions e.g. in the direction of the rotation axis (y axis). The signal processing element may be configured to generate pulses based on a crossing of a threshold of the tapped signal. Each pulse may then be indicative of an angular change based on a rotation of a magnetic field vector.

Figure 2A:
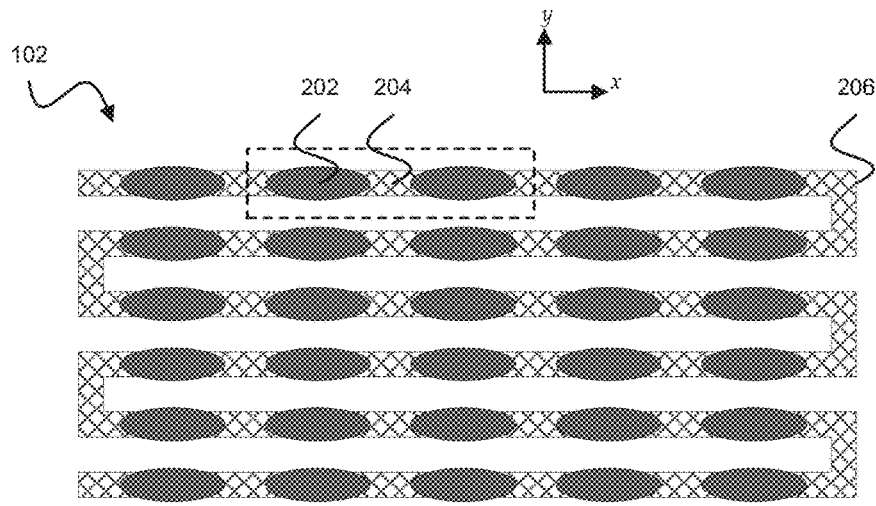
FIG. 2A shows a schematic top view of an arrangement of magneto resistive sensing elements.

Each of the resistors 102 shown in FIG. 1A includes a plurality of electrically connected magneto resistive sensing elements which may be of a spin-valve type. FIG. 2 shows an example embodiment of magneto resistive sensing elements 202 forming one of the resistors 102. FIG. 2A shows a top view of the magneto resistive sensing elements 202 which are arranged in an array of sensing elements. FIG. 2A shows a linear array of sensing elements with rows and columns. In each row of the array, adjacent magneto resistive sensing elements 202 are serially connected by connecting structures 204. The connecting structures 204 are formed of electric conductive material. The connecting structures 204 contact each of the magneto resistive sensing elements 202 at respective opposing end regions in order to inject an electric current into the magneto resistive sensing elements 202. The resistance of the magneto resistive sensing elements 202 changes based on the sensed magnetic field. Thus, a current flowing through each of the magneto resistive sensing elements 202 provides a voltage drop between the two current injection regions which depends on the sensed magnetic field. At ends of the rows, a connecting structure 206 is provided to connect a magneto resistive sensing element at the row end to a magneto resistive sensing element of an adjacent row. In one embodiment, the connecting structures 204 and 206 are formed of metal.

Figure 2B:
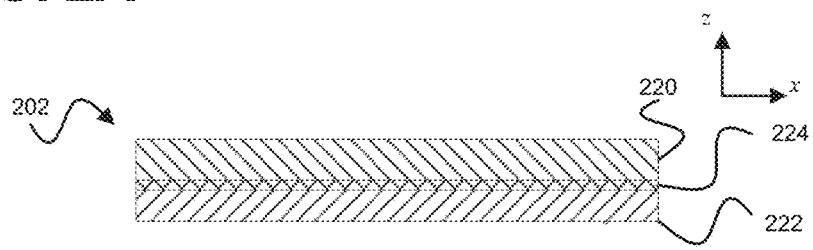
FIG. 2B shows a schematic cross-sectional view of a magneto resistive sensing element.

The magneto resistive sensing elements 202 forming a respective resistor 102 may include GMR (Giant Magneto resistive) sensing elements of the spin-valve type, TMR (Tunneling Magneto resistive) sensing elements of the spin-valve type or other magneto resistive sensing element of a spin-valve type. FIG. 2B shows a cross-sectional cut perpendicular to a main surface of an example magneto resistive sensing element of a spin-valve type. The magneto resistive sensing element 202 of a spin-valve type includes at least a reference layer 220 and a free layer 222 which are separated in a vertical direction (z-axis) by a non-magnetic layer 224.

The reference layer 220 may be part of a reference system (not shown in FIG. 2B) which may include a stack of layer. In some embodiments, the reference system may include the reference layer 220, a pinned layer and a natural antiferromagnet layer. The free layer 222 may be part of a free layer system (not shown in FIG. 2B) which may include a stack of layers. In some embodiments, the free layer system includes the free layer 222 and a cap layer. In some embodiments, the free layer system includes the free layer and a seed layer. The magneto resistive sensing elements 202 may be manufactured by forming the stack of layers on a preprocessed wafer and thereafter structuring (e.g. by an etching process) the wafer stack into separate elements to form the multiple sensing elements. Other embodiments may use different manufacturing processes to manufacture the magneto resistive sensing elements 202. According to some embodiments, the layer stack may be formed on a metal stack, wherein structured metal layers of the metal stack and metal-filled vias provided in the metal stack provide interconnect functionality for the magneto resistive sensing elements 202 as will be described later on.

In a GMR sensing element of a spin-valve type, the non-magnetic layer 224 may be electrically conductive. In a TMR sensing element of a spin-valve type, the non-magnetic layer may be formed of electric insulating material.

The reference layer 220 has a permanent reference magnetization in a fixed reference direction while the magnetization of the free layer 222 can freely rotate depending on an external magnetic field. If the external magnetic field vector changes direction, the magnetization of the free layer 222 changes while the reference magnetization maintains the direction. The resistance of the magneto resistive sensing element 202 typically depends on the angle between the reference magnetization and the magnetization of the free layer. It is to be noted that in other embodiments the resistors may be formed of other materials or other arrangements of the magneto sensitive magneto resistive sensing elements 202 may be provided.

The external magnetic field provided in speed sensing application for example by an encoder wheel such as shown in FIG. 1B is typically a weak magnetic field. In speed sensing applications, the magnetization of the free layer is typically therefore in a regime where the magnetization is not fully saturated. When the magnetic speed sensor is operated in a non-saturated regime, domains of the free layer may be magnetized in directions different to the external magnetic field as will be explained below.

Ideally, the magnetization of the sensor element follows freely the applied external magnetic field. This holds true for non-patterned isotropic magnetic films. However, for narrow stripe like structure the magnetic dipoles within the free layer tend to align along the edges of the element leading to a preferred orientation of the magnetization along the stripe causing shape anisotropy. While in general this shape anisotropy has a stabilizing effect on the sensor output, problems arise if an external magnetic field is applied that leads to a reversal of the edge magnetization, i.e. a change of the magnetic half space. In such a case the sensor shows a stepwise change potentially causing an erroneous or inaccurate signal. This can happen in pole wheel applications such as shown in FIG. 1B or other applications where the magnetization vector is rotating in the sensor plane. If the amplitude of the magnetization along the stripe width is large enough it can cause the described change of the magnetic half space. The sudden turning of the direction of non-aligned magnetization domains may cause a non-continuous and non-predictable jump of the resistance of the magneto resistive sensing element. In the sensing signal such non-continuous resistance variations are seen as jitter in the signal which reduces the accuracy of the speed sensing.

In some embodiments the sensing signal is processed in the speed sensor to trigger and output a pulse when the sensing signal crosses a threshold. In view of the above described jitter of the sensing signals, the pulses output by the sensor to indicate a rotation then include jitter as well. In applications which require high accuracy such as for example in applications using the rotation speed sensor signal of a wheel speed sensor for indirect tire pressure monitoring, low jitter in the signal is desirable for performance reasons.

Also, for magneto resistive wheel speed sensors typically mounting positions may exist in which the sensor may be capable to sense the rotation with low jitter. However, for conventional narrow stripe like structures, if these structures are placed away from the ideal position, a significant jitter will be present.

Embodiments described herein propose concepts which improve the switching process between the magnetic half spaces of GMR-speed sensor device and are therefore capable to decrease jitter and increase the position tolerance.

In a first aspect, embodiments herein propose a specific shape of the free layer to reduce jitter. In the design of magneto resistive sensing elements of the spin-valve type, different factors have to be considered. While a symmetric shape of the free layer with an aspect ratio of 1 such as for example a circle shape may result in a jitter free operation of the sensor (aspect ratio being the ratio of maximum length in lateral direction to maximum width in lateral direction), for reasons of suppressing a background magnetic field a shape anisotropy resulting in an aspect ratio of 1 is not efficient.

Embodiments herein propose a free layer with a rounded fully convex shape having an aspect ratio of at least 2. The contour of the free layer may for example include any fully convex shaped form with aspect ratio of at least 2 having a closed boundary curve with no sharp corners. Examples include but are not limited to an ellipse with an aspect ratio (ration of major axis to minor axis) of at least 2.

In a second aspect, the jitter experienced in magneto resistive speed sensors of the spin-valve type is addressed in embodiments by providing for each Wheatstone resistor a high number of magneto resistive sensing elements 202 tailored to the application of speed sensing. The high number of magneto resistive sensing elements 202 is configured to statistically average jitter effects. In some embodiments, the magneto resistive sensing elements 202 may be serial connected to form the Wheatstone resistor. The magnetoresistive sensing elements 202 may also connected in parallel and both in parallel and series to form a resistor. In some embodiments, magneto resistive sensing elements 202 of a first group are parallel connected to each other and magneto resistive sensing elements 202 of a second group are parallel connected to each other. The first and second group are serial connected to form a Wheatstone resistor.

While some embodiments may use only one of the aspects, embodiments described therein also address a combination of the two aspects such that the jitter experienced in magneto resistive speed sensors of the spin-valve type is addressed in embodiments by providing for each Wheatstone resistor 102 a high number of magneto resistive sensing elements 202 and a specific shape of the free layer 222 of the magneto resistive sensing elements 202.

Figure 2C:
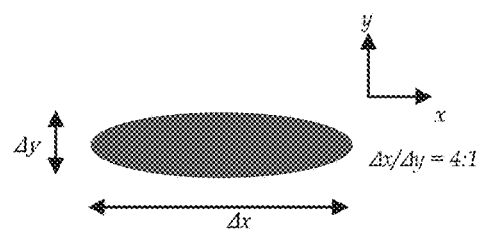
FIGS. 2C and 2D show a top view of different free layer shapes.
Figure 2D:

Referring now to FIGS. 2C and 2D, embodiments of magneto resistive sensing elements 202 having a fully convex shape with an aspect ratio of more than 2 are described. In embodiments, the convex shape may have symmetry with a major symmetry axis and a minor symmetry axis as for example provided in an elliptic shape.

FIG. 2C shows an embodiment with an aspect ratio of 4:1 (major axis to minor axis) and FIG. 2D shows an embodiment with an aspect ratio of 8:1. The embodiments of FIGS. 2C and 2D show elliptical shapes as one example of a convex shape. In other embodiments, the convex shape may be non-elliptical. In embodiments, the convex shape is a rounded convex shape having a continuous smooth boundary, i.e. the boundary of the convex shape has no corners.

The plurality of magneto resistive sensing elements 202 may in one embodiment include at least one thousand magneto resistive sensing elements 202 for each Wheatstone resistor 102. These sensing elements can be connected in series, in parallel, in a combination of series and parallel connection, and can have a variety of shapes within one resistor. In other embodiments, each Wheatstone resistor 102 may comprise at least five hundred magneto resistive sensing elements 202. In other embodiments, each Wheatstone resistor 102 may comprise at least one hundred magneto resistive sensing elements 202.

Figure 2E:
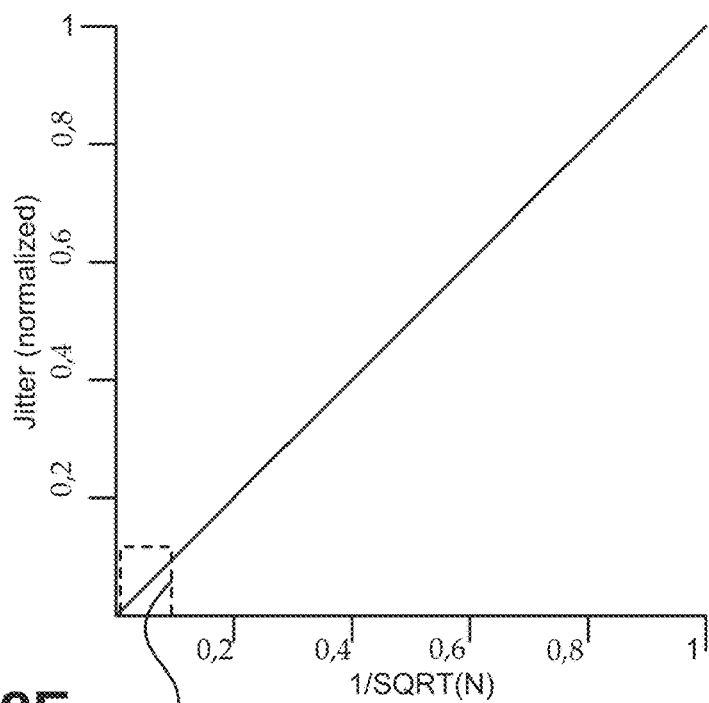
FIGS. 2E and 2F show a diagram illustrating a jitter dependent on a number of magneto resistive sensing elements.
Figure 2F:
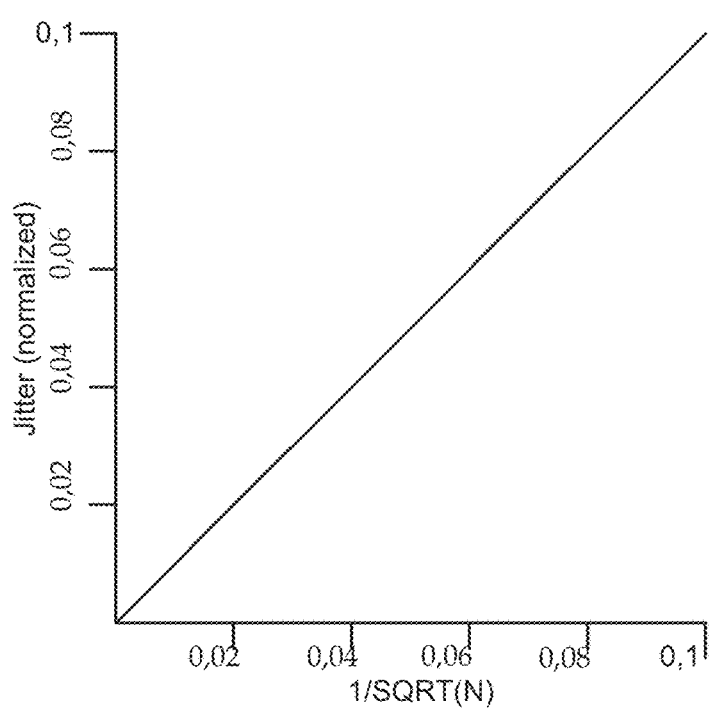

FIGS. 2E and 2F show a simulation result for elliptical shapes with an aspect ratio of 6. FIGS. 2E and 2F show the jitter as a function of the number of magneto resistive sensing elements. The abscissa depicts the number of magneto resistive sensing elements with a function of 1/sqrt(N) where N is the number of magneto resistive sensing elements 202. The ordinate depicts the jitter in a normalized scale (normalized to N=1). FIG. 2F shows the dashed portion of FIG. 2E with a larger scale. As can be seen from FIGS. 2E and 2F, the jitter is normalized such that for an abscissa value of 1 (equal to N=1, i.e. a single magneto resistive sensing element) the normalized jitter value is 1. The jitter is significantly reduced to values below 0.05 (i.e. 5% of the jitter present for a single magneto resistive sensing element) when providing more than 400 magneto resistive sensing elements 202 and to 0, 01 or less (1% of the jitter present for a single element) when providing one thousand or more magneto resistive sensing elements 202. It becomes apparent from the above that for speed sensing applications requiring low jitter, a high number of magneto resistive sensing elements 202 per resistor can be used to meet jitter requirements and provide increased mechanical tolerances for sensor mounting.

In the following, various embodiments of connecting the magneto resistive sensing elements 202 to provide a resistor will be described in more details. For better clarity and visibility, the following embodiments show only a part of the magneto resistive sensing elements 202. The magneto resistive sensing elements 202 may for example correspond to the two magneto resistive sensing elements 202 shown in FIG. 2 within the dashed rectangle.

Figure 3A:
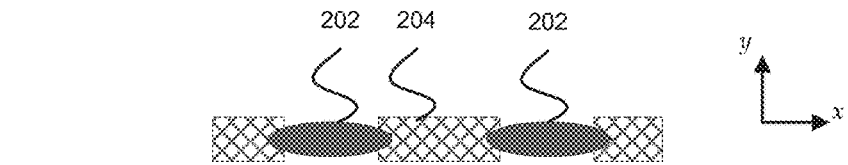
FIGS. 3A and 3B show a top view and a cross-sectional view of example structures.
Figure 3B:
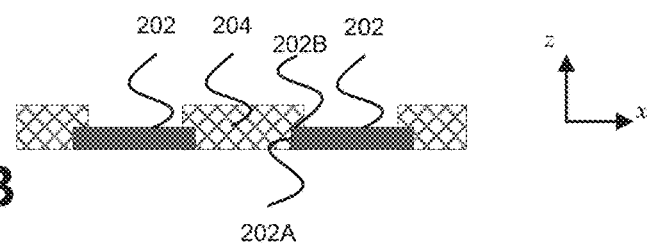

FIGS. 3A and 3B show an embodiment wherein the magneto resistive sensing elements 202 are connected via connecting structures 204 overlapping the magneto resistive sensing elements 202. FIG. 3A shows a top view parallel to a main surface of the magneto resistive sensing elements 202 and FIG. 3B shows a cross-sectional view perpendicular to a main surface and along a major axis (x-axis) of the magneto resistive sensing elements 202. As can be seen, the connecting structure 204 extends between two adjacent magneto resistive sensing elements 202. The connecting structure 204 contacts respective magneto resistive sensing elements 202 at each lateral end region such that the magneto resistive sensing element 202 is contacted at a rim portion 202A and a top side portion 202B of a respective magneto resistive sensing element 202. The connecting structure 204 may contact the top side portion 202B of a respective magneto resistive sensing element 202 in an area of for example up to 15% of the total area of the magneto resistive sensing element 202. The contact interface between the connecting structures 204 and the magneto resistive sensing elements 202 may be plane and continuous. In some embodiments, the connecting structures 204 may extend in a vertical direction (z-direction) up to double the vertical extension of the magneto resistive sensing element 202. In some embodiments, the connecting structures 204 may extend in a vertical direction more than double the vertical extension of the magneto resistive sensing element 202.

In the embodiment of FIGS. 3A and 3B, the bottom portion of the magneto resistive sensing elements 202 are not contacted by the connecting structures 204. The bottom portions of the connecting structure 204 may be flush with the bottom portions of the magneto resistive sensing elements 202. In FIGS. 3A and 3B, the connecting structures 204 have a rectangular shape, however other embodiments may use other shapes for the connecting structures 204. It is to be noted that the connecting structures 206 may be formed in a similar manner as described above for the connecting structures 204.

Figure 4A:
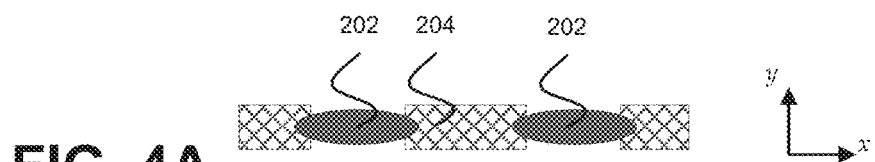
FIGS. 4A and 4B show a top view and a cross-sectional view of example structures.
Figure 4B:
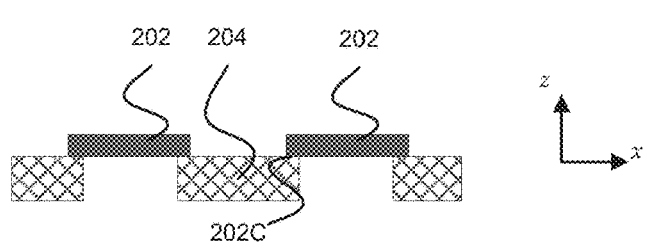

FIGS. 4A and 4B show an embodiment wherein the connecting structures 204 are arranged to contact the magneto resistive sensing elements 202 on a bottom portion of the magneto resistive sensing elements 202.

As can be seen from FIG. 4B, the connecting structures 204 are arranged with respect to the vertical direction below the magneto resistive sensing elements 202 such that the contact interface is only established between a bottom portion 202C of a respective magneto resistive sensing element 202 and a top portion of the connecting structures 204. In the embodiment of FIGS. 4A and 4B, the bottom portion 202C of a respective magneto resistive sensing element 202 and a top portion of the connecting structure 204 are flush. As can be seen from FIGS. 4A and 4B, the connecting structure 204 extends in a lateral direction beyond the magneto resistive sensing element 202.

Figure 5A:
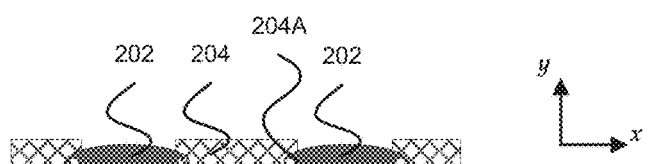
FIGS. 5A and 5B show a top view and a cross-sectional view of example structures.
Figure 5B:
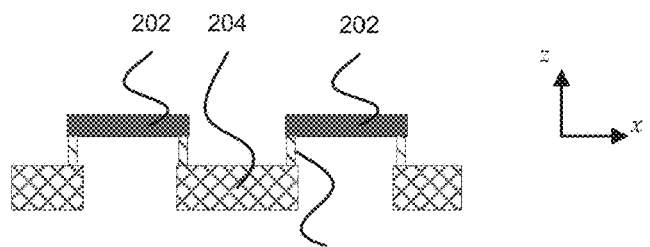

A further embodiment wherein the connecting structures 204 contact the magneto resistive sensing elements 202 on a bottom portion of the magneto resistive sensing elements 202 is shown in FIGS. 5A and 5B. The connecting structures 204 have a vertical extending portion 204A such as a via extending from a top surface of the connecting structures 204 up to a bottom portion of the magneto resistive sensing elements 202 to establish the contact. In other words, the vertical extending portion 204A establishes a connection between a magneto resistive sensing element 202 and a connecting structure 204 lying at a lower level. The vertical extending portion 204A may allow contacting the magneto resistive sensing elements 202 in only a small area of the magneto resistive sensing element 202 as shown in FIGS. 5A and 5B. In other embodiments which are described later on, the vertical extending portion 204A may at the contact interface extend lateral beyond the magneto resistive sensing elements 202. The vertical extending portion 204A may contact each of the magneto resistive sensing elements 202 at respective opposing end regions in order to inject an electric current into the magneto resistive sensing elements 202. In some embodiments, the vertical extending portion 204A may contact each of the magneto resistive sensing elements 202 with a respective small distance from the respective border end of the respective sensing element 202

Figure 6A:
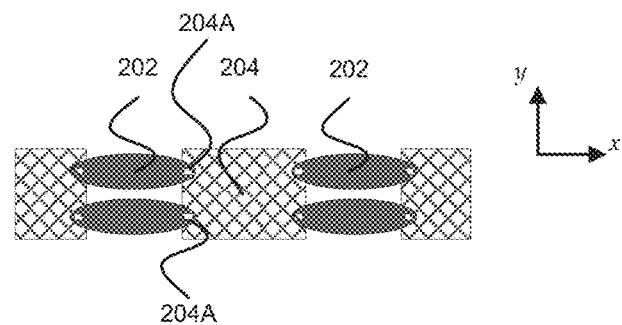
FIGS. 6A and 6B show a top view and a cross-sectional view of example structures.
Figure 6B:
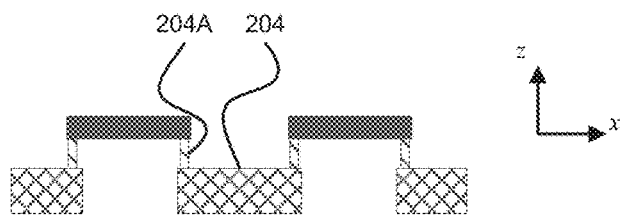

Referring to FIGS. 6A and 6B, an embodiment is shown wherein respective pairs of magneto resistive sensing elements 202 are parallel connected by the connecting structure 204. As can be seen in FIGS. 6A and 6B, at each end of each of the connecting structures 204 two of the vertical extending portions 204A as described in FIGS. 5A and 5B are arranged. At a respective end, a first one of the vertical extending portions 204A contacts a bottom portion of a first magneto resistive sensing element 202 of the pair and a second one of the vertical extending portions 204A contacts the bottom portion of a second magneto resistive sensing element 202 of the pair such that the pair of magneto resistive sensing elements 202 are parallel connected.

Figure 7A:
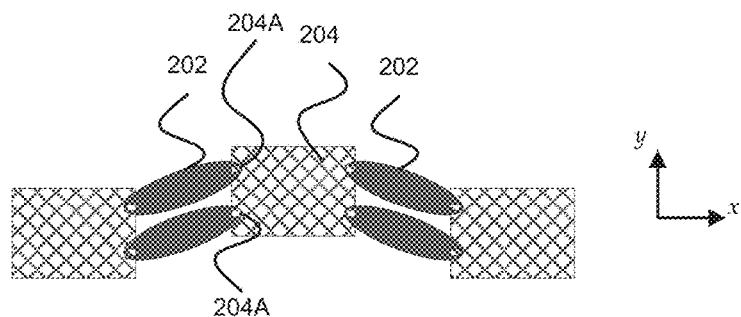
FIGS. 7A and 7B show a top view and a cross-sectional view of example structures.
Figure 7B:
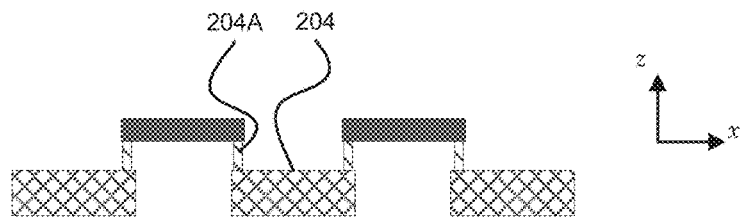

FIGS. 7A and 7B show an embodiment wherein adjacent magneto resistive sensing elements 202 are tilted to each other, e.g. two neighboring magneto resistive sensing elements 202 are arranged to have the respective main axis of the ellipse non parallel. As can be seen from FIGS. 7A and 7B, pairs of magneto resistive sensing elements are parallel connected similar to FIGS. 6A and 6B. Distinguished from FIGS. 6A and 6B, respective adjacent pairs of magneto resistive sensing elements are tilted in different directions. As can be seen in FIG. 7A, a first pair of the magneto resistive sensing elements is tilted in a counter-clockwise direction while a second pair is tilted in a clockwise direction. In some embodiments, this may be repeated such that a tilting of a pair in a counter-clockwise direction is followed by a tilting the next pair in a clockwise direction. It is to be understood that the tilting may also be provided for single connected sensing structures similar to FIG. 3A, 3B, 4A, 4B or 5A, 5B.

Figure 8:
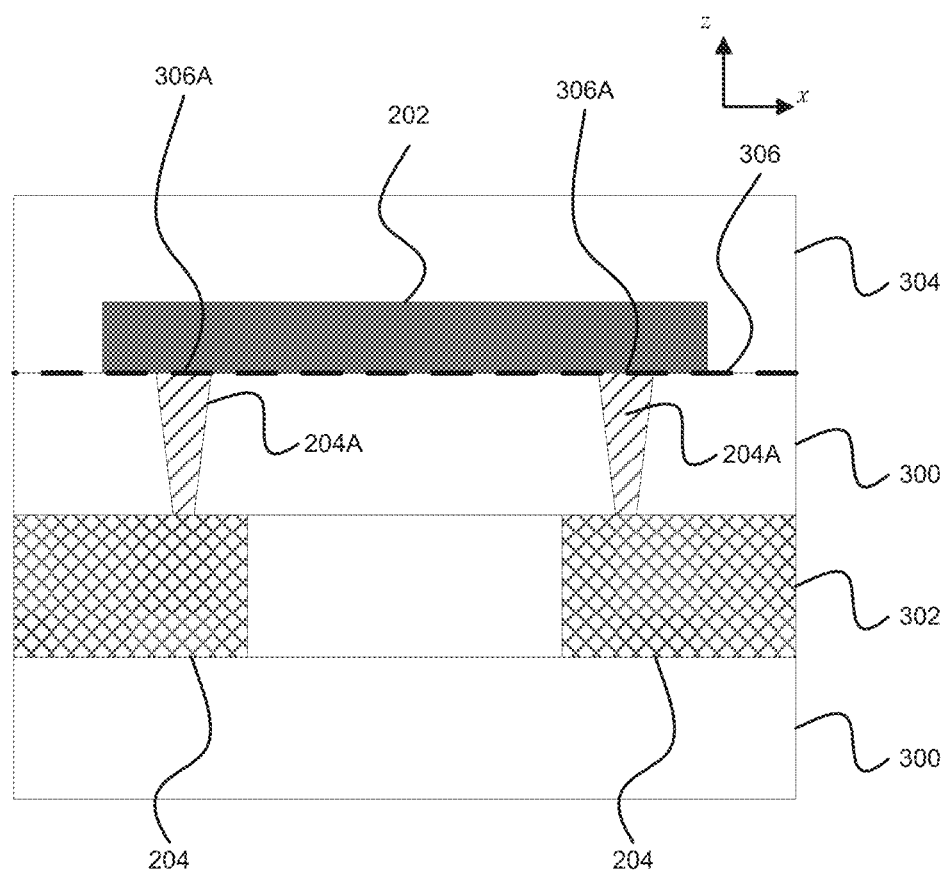
FIG. 8 shows a cross-sectional view of example structures.

FIG. 8 shows an embodiment in which the magneto resistive sensing elements 202 are integrated in a CMOS logic. In the embodiment shown in FIG. 8, the vertical extending portions 204A are metal filled vias extending vertically in one or more electrical isolating interconnect layer 300 of a chip metal stack. At the bottom, the respective vertical extending portions 204A contact the connecting structure 204. At the top, a respective vertical extending portion 204A contacts a magneto resistive sensing element 202 in a contact area 306A of the interface plane 306. The region in the interface plane 306 in which both the respective vertical extending portion 204A and the respective magneto resistive sensing element 202 are formed and hence contact each other defines the respective contact area 306A. In embodiments, the vertical extending portion are formed of vias which directly contact the magneto resistive sensing element 202 such as shown in FIG. 8. However, in some embodiments, the vertical extending portion 204 may be formed by a via and an additional conductive lateral extending portion directly above the via and sandwiched between the via and the magneto resistive sensing element 202.

The chip metal stack comprises at least the electrical isolating interconnect layer 300 and at least one metal layer 302 arranged between two interconnect layers 300. The interconnect layer 300 is typically formed of dielectric material such as silicon oxide or low k materials. The metal layer 302 is typically formed of structured metal sheet such as a structured copper or aluminum sheet with isolation material between the structured metal portions.

Figure 9A:
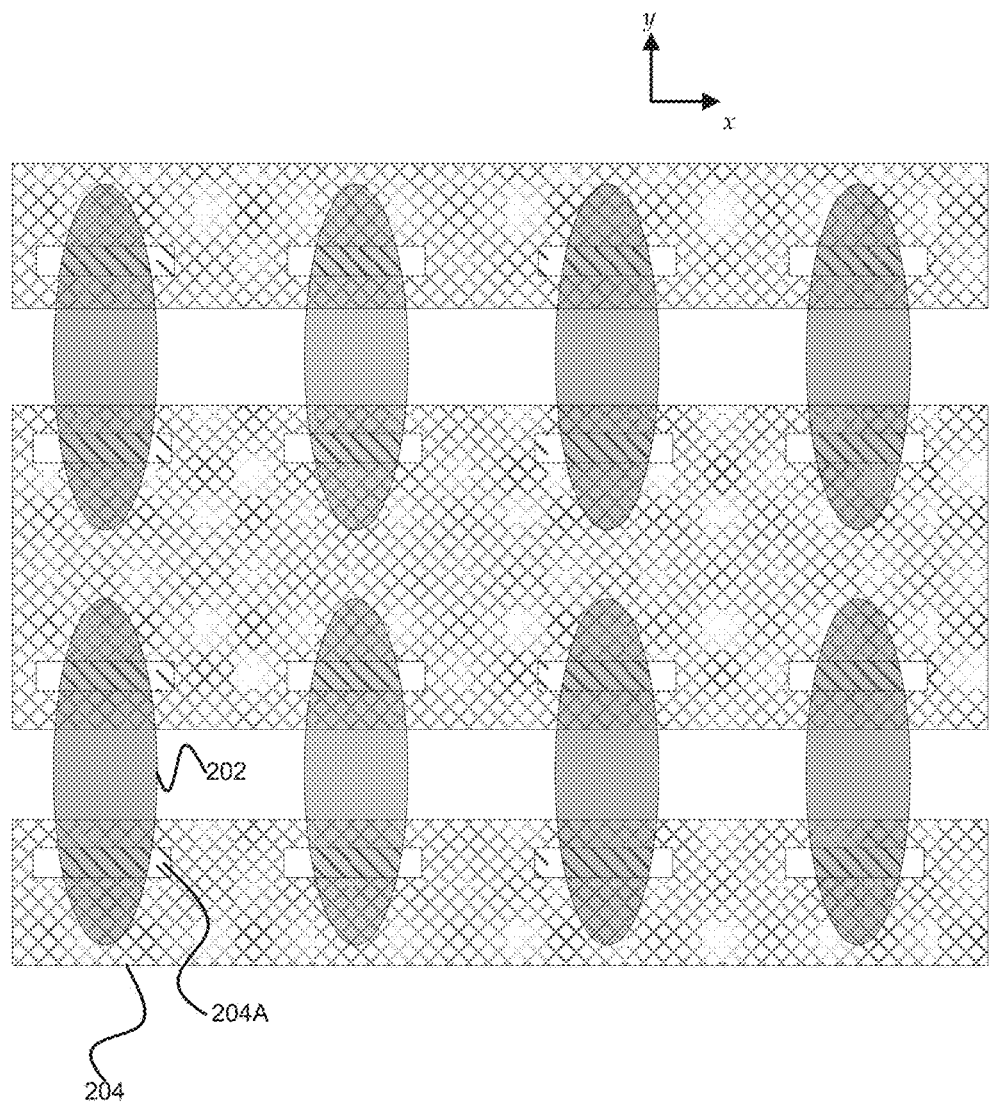
FIGS. 9A to 9D show a top view of example structures.
Figure 9B:
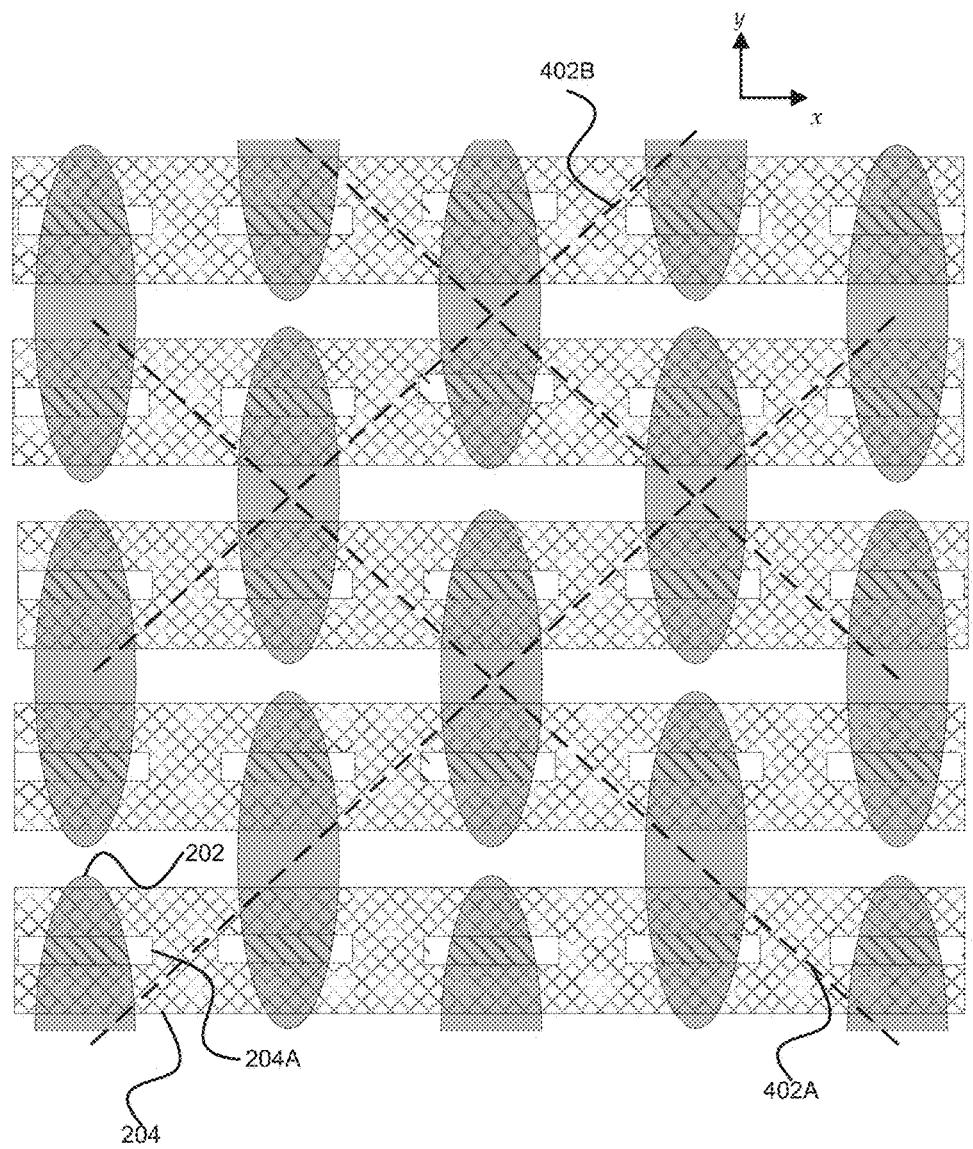
Figure 9C:
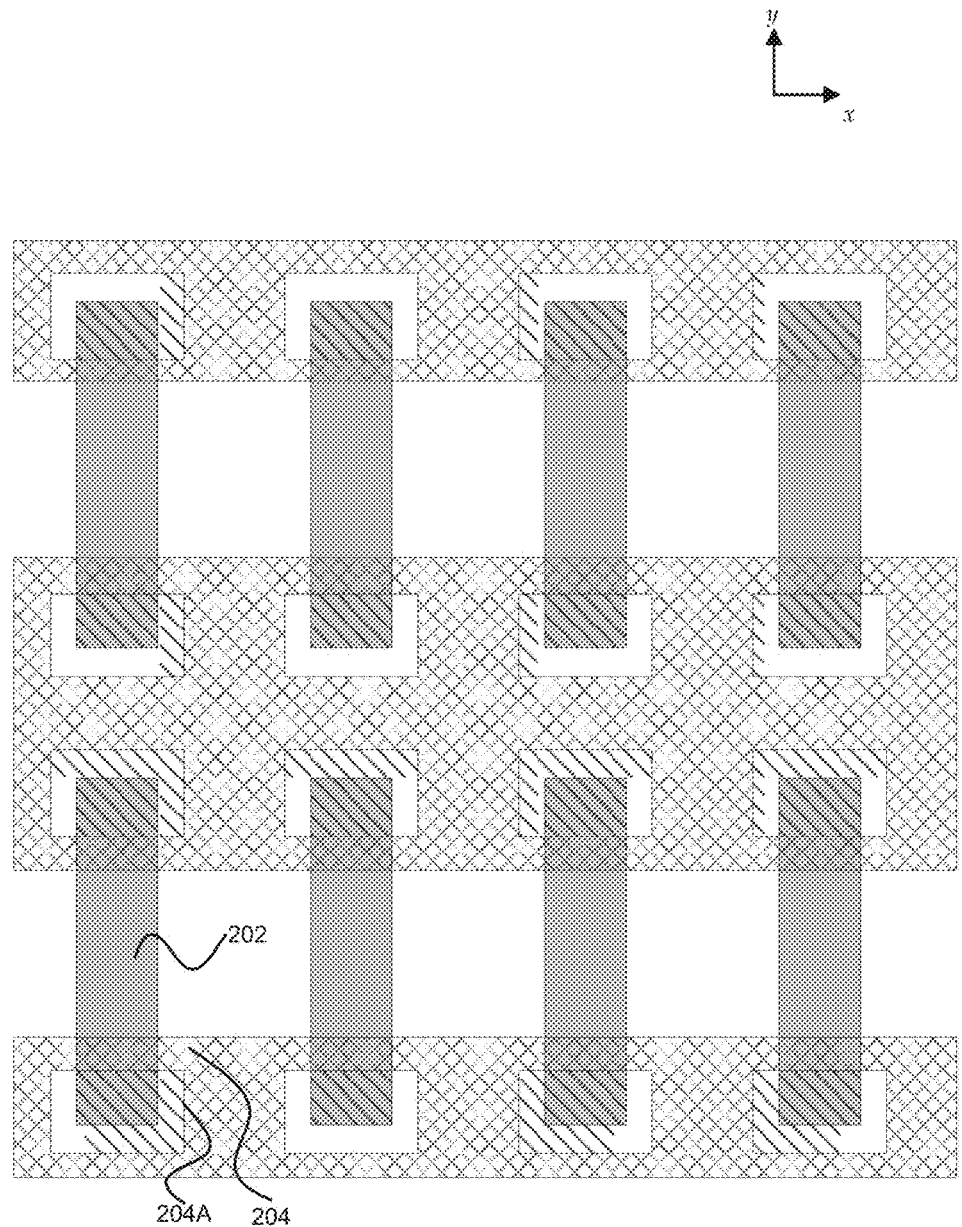

Referring now to FIGS. 9A to 9C, further embodiments are shown in which a vertical extending portion 204A contacting a respective magneto resistive sensing element 202 extends in at least one lateral direction beyond the magneto resistive sensing element 202. In other words, the vertical extending portion 204A protrudes at the interface plane the magneto resistive sensing element 202 in at least one lateral direction. In embodiments, the lateral direction may be a width direction of the magneto resistive sensing element 202 (direction perpendicular to the length direction). In some embodiments, the lateral direction may be a length direction of the magneto resistive sensing element. In some embodiments, the vertical extending portion may protrude the magneto resistive sensing element 202 in both, width direction and length direction of the magneto resistive sensing element 202. In some embodiments, the vertical extending portion may protrude the magneto resistive sensing element 202 in only one of the width or length direction of the magneto resistive sensing element 202.

Since the vertical extending portion 204A protrudes the magneto resistive sensing element 202, an area of a cut through the vertical extending portion 204A along the interface plane is therefore greater than an area of contact between the magneto resistive sensing element and the vertical extending portion. In some embodiments, the area of the vertical extending portion 204A along the interface plane is at least a factor of two of the contact area. In other embodiments, the area of the vertical extending portion 204A along the interface plane is at least a factor of 1.5 of the contact area. In some embodiments, the vertical extending portion 204A extends in a lateral direction at least 1.1 times the extension of the area of contact in these directions.

In some embodiments, the vertical extending portion 204A extends in a lateral direction at least 1.2 times the extension of the area of contact in these directions.

In some embodiments, the vertical extending portion 204A extends in a lateral direction no more than double the extension of the area of contact in these directions.

In some embodiments, the vertical extending portion 204A extends in a lateral direction no more than triple the extension of the area of contact in these directions.

The values mentioned above provide for a more stable interconnect as will be described now.

By protruding the magneto resistive sensing element, an overlap of the XMR line edge to the vertical extending structure is defined. The structures ensure a more stable interconnect performance. Typically, a minimal possible structure size is limited by the manufacturing process capabilities, e.g. accuracy of lithographic alignment. If the width of the magneto resistive sensing elements 202 is small and already close to this limit, it may not be possible to achieve a defined position of the vertical extending portion 204A within the magneto resistive sensing elements 202. However, as previously described, small widths of the magneto resistive sensing element 202 are desirable in order to obtain a high aspect ratio. Due to the limited accuracy it may in some cases not even be guaranteed to ensure placement of the vertical extending portion 204A within the area of magneto resistive sensing element 202. Undefined and varying contacting positions would result in non-uniform or even no injection of the current into the magneto resistive sensing element 202.

With the vertical extending portion 204A protruding the magneto resistive sensing element 202 in at least one lateral direction, a larger contact area and therefore a lower contact resistance at the magneto resistive sensing element interconnect can be achieved. Therefore, more robustness against overlap tolerance is obtained. If the overlap is sufficiently large, the contact area remains constant even when the center position of the vertical extending portion 204A slightly varies due to the accuracy of the lithographic alignment. The diameter size of the vertical extending portion 204A is then a less critical parameter. Larger size countermeasures against void creation can also be implemented for example like tapered side walls or a top broadening.

The magneto resistive sensing elements 202 are shown in FIGS. 9A to 9C semi-transparent in order to reveal the connecting structure 204 and the vertical extending portion 204A of the connecting structure below. FIG. 9A shows a vertical projection of a first embodiment wherein the magneto resistive sensing elements 202 are connected via the vertical extending portions 204A which overlap the magneto resistive sensing elements 202. Thus, the vertical extending portions 204A extend in lateral direction beyond the magneto resistive sensing elements. In some embodiments, the vertical extending portion 204A extends in x-direction at both lateral sides of the vertical extending portion 204A beyond the magneto resistive sensing element 202. As can be seen from FIG. 9A, the lateral overlap is established in a direction perpendicular to the main electric current direction which is between the two current injection regions. Typically, the main electric current direction corresponds to the length direction of the magneto resistive sensing element 202. However, other embodiments may include slightly different directions.

In FIG. 9A, the magneto resistive sensing elements 202 are arranged in rows. Within a same row, the magneto resistive sensing elements 202 are parallel connected. The magneto resistive sensing elements 202 within a same row contact a same connecting structure 204 exclusively either with a vertical extending portion 204A that injects the current into the magneto resistive sensing element 202 or a vertical extending portion 204A that draws the current from the magneto resistive sensing element 202.

Contrary thereto, FIG. 9B shows an embodiment wherein magneto resistive sensing elements 202 of a row are arranged interlocked with magneto resistive sensing elements 202 of an adjacent row. The magneto resistive sensing elements 202 in one row are arranged with space in between so that magneto resistive sensing elements 202 of adjacent rows can extend into this space. Except for the first and last rows, the magneto resistive sensing elements 202 of one row are therefore arranged interlocking with the magneto resistive sensing elements 202 of an adjacent row. As explained above, a first vertical extending portion 204A contacts the magneto resistive sensing element 202 at a first end and a second vertical extending portion contacts the magneto resistive sensing elements at a second end of the magneto resistive sensing element opposed to the first end. It is further to be noted in FIG. 9B that vertical extending portions 204A contacting the sensing structure at a first end (e.g. lower end) are connected to a first row of the connecting structure 204 while the vertical extending portions 204A contacting the sensing structure at a second end (e.g. upper end) are connected to an adjacent second row of the connecting structure 204. Furthermore, in one adjacent row (e.g. below), vertical extending portions 204A contacting a magneto resistive sensing element 202 of this row at a second end are contacted also to the first row of the connecting structure 204. In one other adjacent row (e.g. above), vertical extending portions 204A contacting respective magneto resistive sensing elements 202 of this row at a first end are contacted also to the second row of the connecting structure 204.

As can be seen from FIG. 9B, magneto resistive sensing elements 202 with nearest center to center distance are not arranged in a row parallel to the connecting structure 204 but on diagonals 402A and 402B.

In some embodiments, the vertical extending portion 204A may have a cuboid or cylindric shape. In other embodiments, the vertical extending portion 204A may have a tapered side wall. In such embodiments, the vertical extending portion 204A may have a frustum shape or a quadrilateral frustum shape.

While FIGS. 9A and 9B show magneto resistive sensing elements 202 of ellipse shape, it is to be understood that the magneto resistive sensing elements 202 may have other shapes, e.g. rectangular as shown in FIG. 9C.

As can be seen from FIG. 9C, rectangular shaped magneto resistive sensing elements 202 are again arranged in rows. Each magneto resistive sensing element 204 has a length (longer distance of the rectangular) and a width (smaller distance of the rectangular). The vertical extending portions 204A are contacting the magneto resistive sensing elements 202 at the respective opposite ends. It can be seen from FIG. 9C that a respective vertical extending portion 204A extends in a length direction at one side beyond the magneto resistive sensing element 202. Furthermore, the same vertical extending portion 204A extends in a width direction (x-direction in FIG. 9C) at both sides beyond the magneto resistive sensing element 202. The arrangement of the magneto resistive sensing elements is similar to FIG. 9B such that the magneto resistive sensing elements 202 within one row are all electrically parallel connected.

Figure 9D:
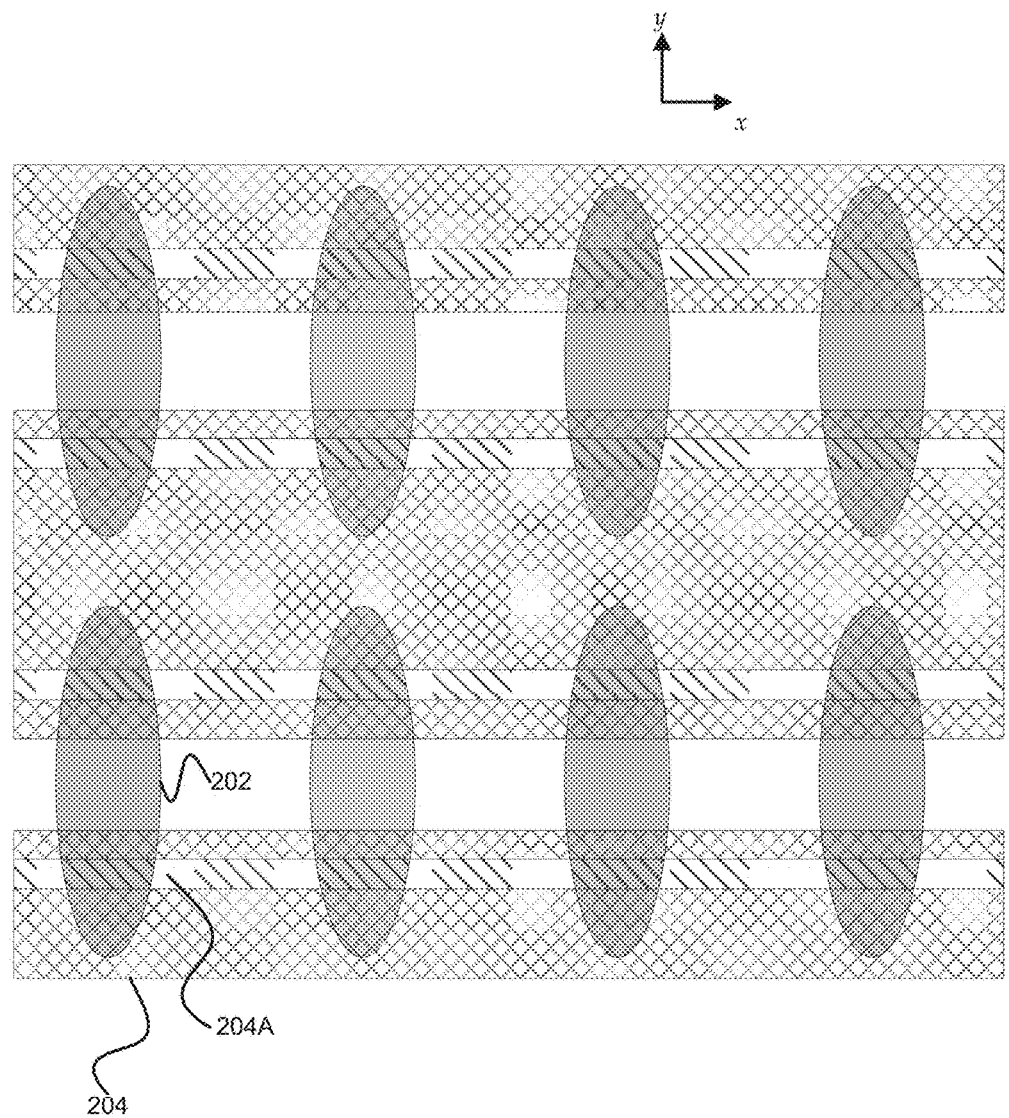

FIG. 9D shows a modification of the embodiment shown in FIG. 9A. Distinguished from FIG. 9A, the vertical extending portion 204A of FIG. 9D extends beyond multiple sensing elements 202 of a row to a provide a common parallel connection for the multiple sensing elements 202.

In some embodiments, one or more of the magneto resistive sensing elements 202 may be provided to be short circuited by the vertical extending portion 204A and the connecting structure 204. Although then no sensing functionality is provided by such magneto resistive sensing elements, it may help to have for each magneto resistive sensing element 202 a same surrounding of magneto resistive sensing elements 202 and ensures that each sensing elements in influenced in the same manner by surrounding sensing elements, whether they are functional or not.

Similar to embodiments described previously, the magnetoresistive sensing elements 202 may be connected in series, parallel or both in parallel and series to form a resistor.

Furthermore, any of the embodiments described with respect to FIGS. 8 and 9A to D can be combined with features described with respect to embodiments related to the previous FIGS. 1 to 7B. For example the embodiments of FIGS. 8 and 9A to D can have a high number of sensing elements e.g. equal or above one hundred, equal or above five hundred or equal or above one thousand. Furthermore, the embodiments of FIGS. 8 and 9A to D can also be applied to devices other than magneto resistive sensor devices.

In the above description, embodiments have been shown and described herein enabling those skilled in the art in sufficient detail to practice the teachings disclosed herein. Other embodiments may be utilized and derived there from, such that structural and logical substitutions and changes may be made without departing from the scope of this disclosure.

This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

It is further to be noted that embodiments described in combination with specific entities may in addition to an implementation in these entity also include one or more implementations in one or more sub-entities or sub-divisions of said described entity. For example, specific embodiments described herein describe the forming of a feature or a process step not shown in another embodiment. It is to be understood that such a feature may be formed also in other embodiments or such a process step may be applied also in other embodiments, unless it is explicitly excluded herein or technically not possible.

The accompanying drawings that form a part hereof show by way of illustration, and not of limitation, specific embodiments in which the subject matter may be practiced.

In the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

Furthermore, it is intended to include in this detailed description also one or more of described features, elements etc. in a reversed or interchanged manner unless otherwise noted.

It is further to be noted that methods disclosed in the specification or in the claims may be implemented by a device having means for performing each of the respective steps of these methods.

Further, it is to be understood that the disclosure of multiple steps or functions disclosed in the specification or claims may not be construed as to be within the specific order. Therefore, the disclosure of multiple steps or functions will not limit these to a particular order unless such steps or functions are not interchangeable for technical reasons.

Furthermore, in some embodiments a single step may include or may be broken into multiple substeps. Such substeps may be included and part of the disclosure of this single step unless explicitly excluded.

The invention claimed is:

1. A magnetic speed sensor device comprising:
a plurality of magneto resistive sensing elements of a spin valve type,
wherein the magneto resistive sensing elements are electrically connected to form a speed sensing arrangement,
wherein each of the plurality of magneto resistive sensing elements comprises a free layer and a reference layer,
wherein the free layer of each magneto resistive sensing element comprises an aspect ratio equal to or greater than 2, and
wherein the free layer of each magneto resistive sensing element comprises a rounded convex contour.

2. The magnetic speed sensor according to claim 1, wherein the plurality of magneto resistive sensing elements are operated in a non-saturated regime.

3. The device according to claim 1, wherein a shape of the free layer comprises a major symmetry axis and a minor symmetry axis, wherein a reference magnetization of the reference layer is in a direction of the minor symmetry axis.

4. The device according to claim 1, wherein the free layer has an elliptic shape.

5. The device according to claim 1, further comprising a signal tap to tap a sensing signal from the plurality of magneto resistive sensing elements and to feed the sensing signal to a signal processing element, wherein the signal processing element is configured to generate pulses based on a crossing of a threshold.

6. The device according to claim 5, wherein each pulse is indicative of an angular change based on a rotation of a magnetic field vector.

7. The device according to claim 1, wherein the device comprises a Wheatstone bridge, wherein each resistor of the Wheatstone bridge comprises one hundred or more magneto resistive sensing elements.

8. The device according to claim 1, wherein the device comprises a Wheatstone bridge, wherein each resistor of the Wheatstone bridge comprises one thousand or more magneto resistive sensing elements.

9. The device according to claim 1, wherein the plurality of magneto resistive sensing elements comprises electric connecting structures to introduce an electric current to each magneto resistive sensing element and to draw an electric current from each magneto resistive sensing element.

10. The magnetic speed sensor according to claim 1, wherein symmetry axes of free layers of the plurality of magneto resistive sensing elements are in a same direction.

11. The magnetic speed sensor according to claim 1, wherein symmetry axes of free layers of the plurality of magneto resistive sensing elements are in different directions.

12. The magnetic speed sensor according to claim 1, wherein the free layer of each magneto resistive sensing element comprises an aspect ratio equal to or greater than 6.

13. A magnetic speed sensor comprising:
a plurality of magneto resistive sensing elements of a spin-valve type electrically connected to form a sensing arrangement, wherein each of the plurality of magneto resistive sensing elements comprises a free layer and a reference layer;
wherein a contour of the free layer of each magneto resistive sensing element has a rounded convex shape with an aspect ratio equal to or greater than 2, and the plurality of magneto resistive sensing elements comprises one hundred or more magneto resistive sensing elements.

14. The magnetic speed sensor according to claim 13, wherein the magnetic speed sensor is configured to sense a rotation of a magnetic field vector and to output pulses.

15. The magnetic speed sensor according to claim 13, wherein the magneto resistive sensing elements are operated in a non-saturated regime.

16. The magnetic speed sensor according to claim 13, wherein the free layer comprises a major and a minor symmetry axis, wherein a reference magnetization provided by the reference layer is in a direction of the minor symmetry axis.

17. The magnetic speed sensor according to claim 13, wherein the free layer comprises an elliptical shape.

18. The magnetic speed sensor according to claim 13, further comprising a signal tap to tap a sensing signal from the sensing arrangement and to feed the sensing signal to a signal processing element, wherein the signal processing element is configured to generate pulses based on a crossing of a threshold.

19. The magnetic speed sensor according to claim 13, wherein the magnetic speed sensor comprises a Wheatstone bridge,
wherein each resistor of the Wheatstone bridge comprises at least more than 1000 magneto resistive sensing elements.

20. The magnetic speed sensor according to claim 13, wherein the plurality of magneto resistive sensing elements comprises elongated electric connecting structures to introduce an electric current to a magneto resistive sensing element and to draw an electric current from the magneto resistive sensing element.

21. The magnetic speed sensor according to claim 13, wherein connecting structures are arranged perpendicular to a minor symmetry axis of the free layer.

22. A method comprising:

sensing a rotation around an axis with a magnetic speed sensor, the magnetic speed sensor comprising a plurality of magneto resistive sensing elements of a spin-valve type forming a sensing arrangement, wherein each of the plurality of magneto resistive sensing elements comprises a free layer and a reference layer; and wherein a contour of the free layer of each magneto resistive sensing element has a rounded convex shape with an aspect ratio equal to or greater than 2, and the sensing arrangement comprises a bridge circuit, wherein each resistor of the bridge circuit comprises at least more than 100 magneto resistive sensing elements.

* * * * *